United States Patent
Yokoyama et al.

(10) Patent No.: US 8,702,197 B2
(45) Date of Patent: Apr. 22, 2014

(54) PIEZOELECTRIC ACTUATOR, LIQUID EJECTION HEAD, AND LIQUID EJECTION APPARATUS

(75) Inventors: Naoto Yokoyama, Suwa (JP); Eiju Hirai, Okaya (JP); Chikara Kojima, Matsumoto (JP)

(73) Assignee: Seiko Epson Corporation, Tokyo (JP)

(*) Notice: Subject to any disclaimer, the term of this patent is extended or adjusted under 35 U.S.C. 154(b) by 50 days.

(21) Appl. No.: 13/398,765

(22) Filed: Feb. 16, 2012

(65) Prior Publication Data

US 2012/0212546 A1 Aug. 23, 2012

(30) Foreign Application Priority Data

Feb. 17, 2011 (JP) ................................. 2011-031712

(51) Int. Cl.
*B41J 2/015* (2006.01)

(52) U.S. Cl.
USPC .......................................................... 347/20

(58) Field of Classification Search
None
See application file for complete search history.

(56) References Cited

U.S. PATENT DOCUMENTS 6,502,928 B1 * 1/2003 Shimada et al. ................ 347/68
2006/0290747 A1 12/2006 Shimada et al.

FOREIGN PATENT DOCUMENTS

WO  WO 2005/028207 A1  3/2005

* cited by examiner

*Primary Examiner* — Matthew Luu
*Assistant Examiner* — Erica Lin
(74) *Attorney, Agent, or Firm* — Kilpatrick Townsend & Stockton LLP (57) ABSTRACT

A piezoelectric actuator includes a vibrating plate having a base surface, a first electrode, a piezoelectric layer, and a second electrode which extends in a first direction. In the piezoelectric actuator, the second electrode has a first portion having a first width, a second portion having a second width which is smaller than the first width, and a third portion which connects the first portion and the second portion, the first electrode has a first side which forms an outer circumference of the first electrode on a plan view, and the third portion of the second electrode is arranged at an upper side of the first side of the first electrode and a third width of the third portion is made narrower from the first portion toward the second portion.

8 Claims, 8 Drawing Sheets

FIG. 13 ized from the first portion toward the second portion. Therefore, a corner
PIEZOELECTRIC ACTUATOR, LIQUID EJECTION HEAD, AND LIQUID EJECTION APPARATUS This application claims a priority to Japanese Patent Application No. 2011-031712 filed on Feb. 17, 2011 which is hereby expressly incorporated by reference herein in its entirety.

BACKGROUND

1. Technical Field

The present invention relates to a piezoelectric actuator, a liquid ejection head, and a liquid ejection apparatus.

2. Related Art

For example, a liquid ejection head which ejects liquid droplets of ink or the like has been known in a liquid ejection apparatus such as an ink jet printer. The liquid ejection head includes a piezoelectric actuator for changing pressures in pressure generation chambers. The piezoelectric actuator has a piezoelectric layer which is sandwiched between an upper electrode and a lower electrode. If the piezoelectric layer is deformed by a driving signal or the like, a vibration plate can be bent. With this, the liquid ejection head can eject ink or the like supplied into the pressure generation chambers through nozzle holes.

The piezoelectric layer of such piezoelectric actuator has a driving region which is sandwiched between the upper electrode and the lower electrode, and non-driving regions which are not sandwiched between the upper electrode and the lower electrode (see, International Publication WO 2005/028207). Since an electric field is applied to an inner side of the driving region by a driving signal or the like, the piezoelectric layer is actively deformed. However, since an electric field is hardly applied to the non-driving regions at the outside of the driving region, the piezoelectric layer cannot be actively deformed. Therefore, a stress such as distortion is concentrated in the vicinity of boundaries between the driving region and the non-driving regions. This arises a possibility that cracking is generated on the piezoelectric layer.

In consideration of the above problem, a piezoelectric actuator on which cracking is difficult to be generated in the vicinity of the boundaries between the driving region and the non-driving regions and which has improved reliability, or the like, has been desired.

SUMMARY

An advantage of some aspects of the invention is to provide a piezoelectric actuator which is capable of suppressing cracking from being generated and has high reliability. Further, another advantage of some aspects of the invention is to provide a liquid ejection head and a liquid ejection apparatus including the above piezoelectric actuator.

1. A piezoelectric actuator according to an aspect of the invention includes a vibration plate having a base surface, a first electrode which is formed on the base surface of the vibration plate, a piezoelectric layer which is formed on the base surface of the vibration plate and the first electrode, and a second electrode which is formed on the piezoelectric layer so as to extend in a first direction. In the piezoelectric actuator, the second electrode has a first portion having a first width, a second portion having a second width which is smaller than the first width, and a third portion which connects the first portion and the second portion, the first electrode has a first side which forms an outer circumference of the first electrode on a plan view when seen from a normal line direction of the base surface and which extends in a second direction perpendicular to the first direction, and the third portion of the second electrode is arranged at an upper side of the first side of the first electrode and a third width of the third portion is made narrower from the first portion toward the second portion.

With the piezoelectric actuator, the second electrode includes the third portion of which width is narrower from the first portion toward the second portion. Therefore, a corner portion having an internal angle of a right angle or an acute angle is not formed on a boundary surface of a driving region of the piezoelectric layer. Therefore, excess concentration of a stress around a boundary between the driving region and a non-driving region can be made to be moderate. Accordingly, cracking due to concentration of the stress can be suppressed from being generated, thereby capable of providing a piezoelectric actuator having high reliability.

Further, with the piezoelectric actuator, an end surface of the first electrode which makes contact with an driving region and the piezoelectric layer around the driving region can be made to be the first side only. With this configuration, larger portions of the piezoelectric layer can be crystallized on an upper surface of the first electrode in a manufacturing stage of the piezoelectric layer. Accordingly, the piezoelectric layer can be made to be a piezoelectric layer on which cracking is difficult to be generated and which has high reliability.

It is to be noted that in the description according to the aspect of the invention, when an expression "upper side" is used in such a manner that "a specific member (hereinafter, referred to as "A") is formed at the upper side of a specific member (hereinafter, referred to as "B")", for example, the expression "upper side" is used including a case where B is directly formed on A and a case where B is formed on A through another member.

2. In the piezoelectric actuator according to the aspect of the invention, it is preferable that the third portion have a second side which forms an outer circumference of the second electrode on the plan view, and an angle formed between the upper side of the first side of the first electrode and the second side, is an obtuse angle.

3. In the piezoelectric actuator according to the aspect of the invention, it is preferable that the second side of the third portion include a straight line.

4. In the piezoelectric actuator according to the aspect of the invention, it is preferable that the second side of the third portion include an arc-like curved line.

5. In the piezoelectric actuator according to the aspect of the invention, it is preferable that a plurality of second electrodes be arranged in parallel along the second direction, the plurality of second electrodes be individual electrodes which are separated from each other, and the first electrode be a common electrode which is common to the plurality of second electrodes.

6. It is preferable that the piezoelectric actuator according to the aspect of the invention further include a fourth portion which is electrically connected to the second portion and has a width of equal to or larger than the second width.

7. A liquid ejection head according to another aspect of the invention includes the piezoelectric actuator according to the above aspect of the invention.

The liquid ejection head according to the invention can have high reliability.

8. A liquid ejection apparatus according to still another aspect of the invention includes the liquid ejection head according to the above aspect of the invention.

The liquid ejection apparatus according to the invention can have high reliability.

BRIEF DESCRIPTION OF THE DRAWINGS

The invention will be described with reference to the accompanying drawings, wherein like numbers reference like elements.

DESCRIPTION OF EXEMPLARY EMBODIMENTS

Hereinafter, a preferred embodiment of the invention is described with reference to drawings.

1. Piezoelectric Actuator

Figure 1A:
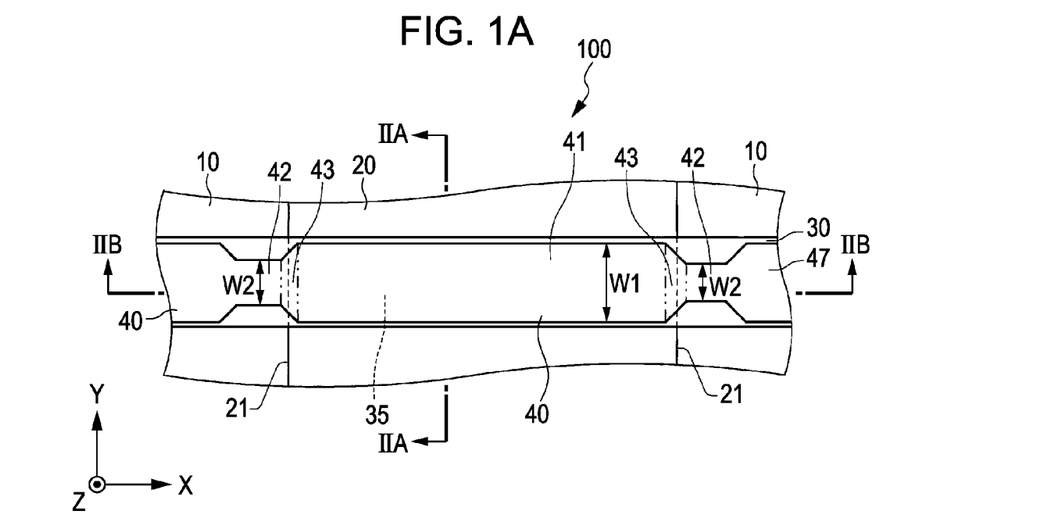
FIGS. 1A and 1B are plan views schematically illustrating a piezoelectric actuator according to an embodiment.
Figure 1B:
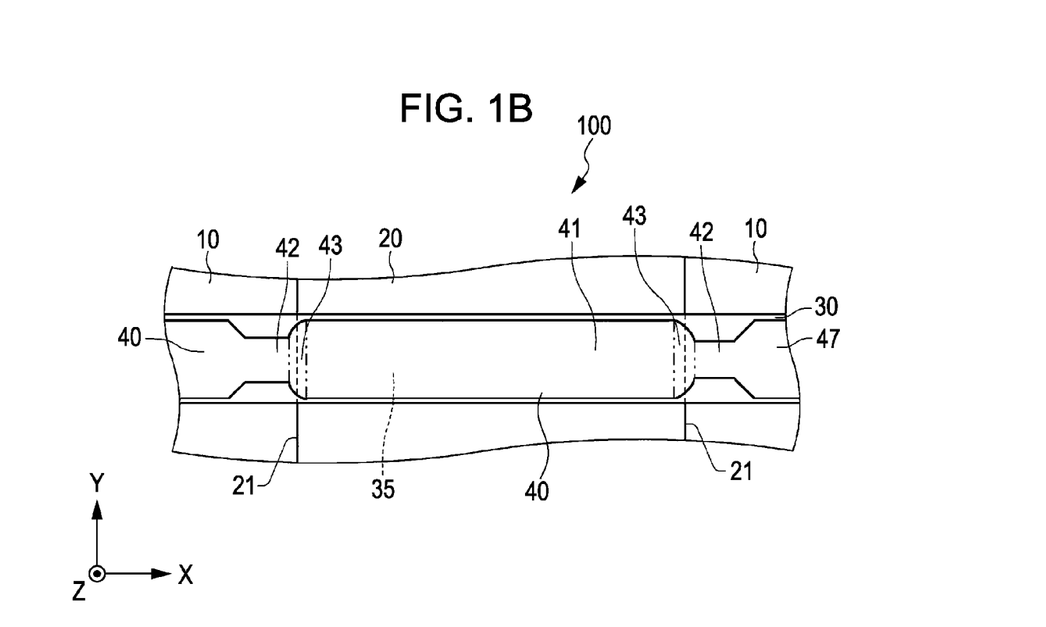
Figure 2A:
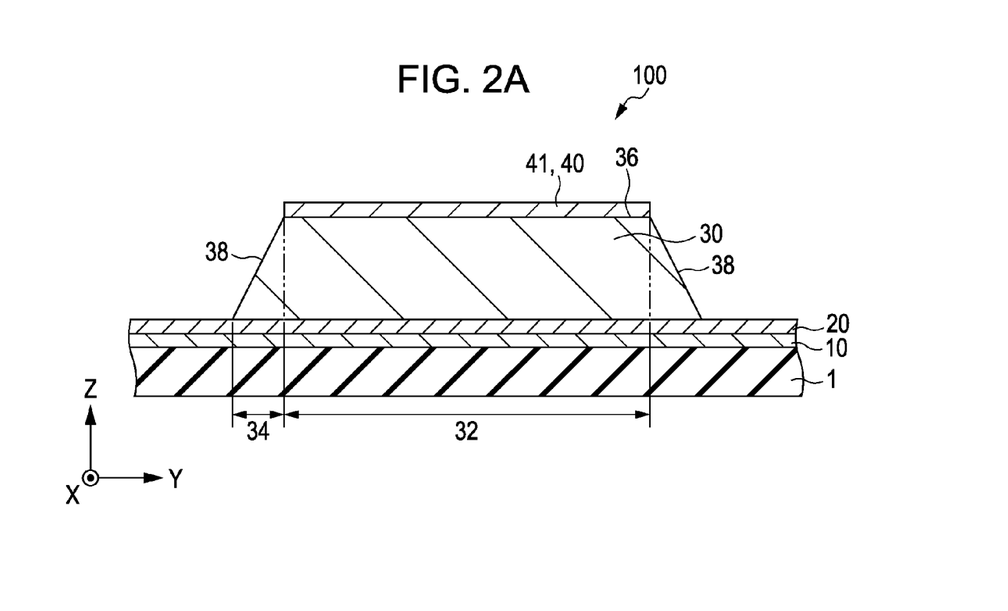
FIGS. 2A and 2B are cross-sectional views schematically illustrating the piezoelectric actuator according to the embodiment.
Figure 2B:
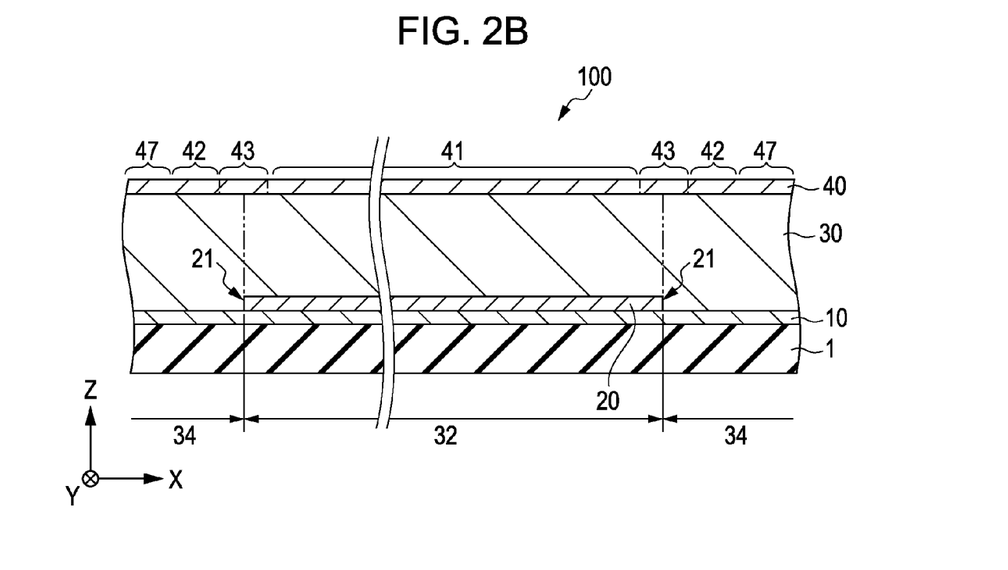
Figure 3A:
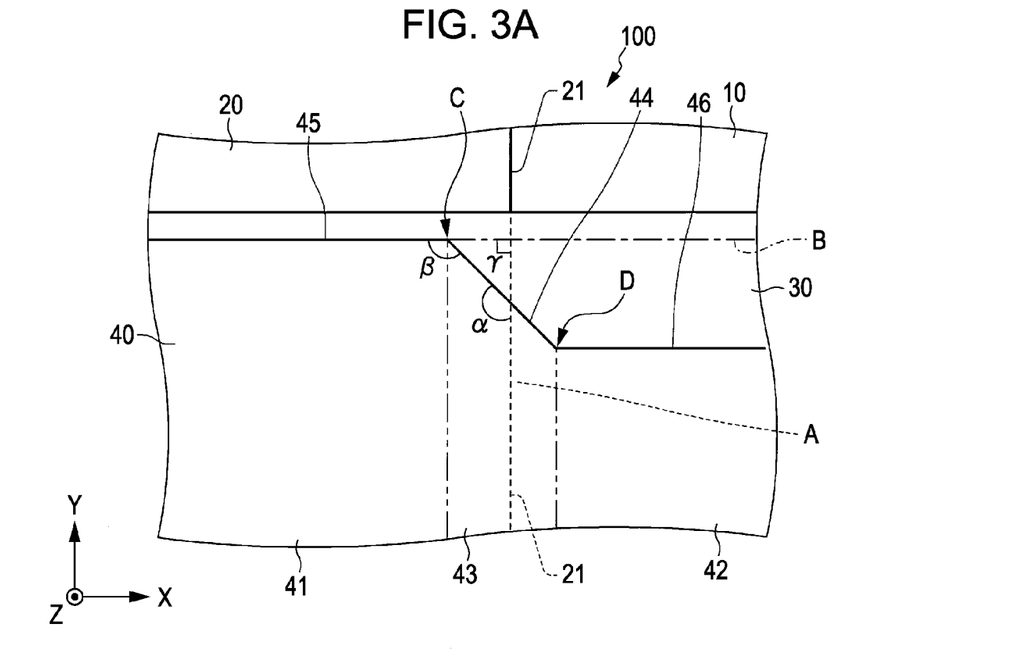
FIGS. 3A and 3B are plan views schematically illustrating the piezoelectric actuator according to the embodiment.
Figure 3B:
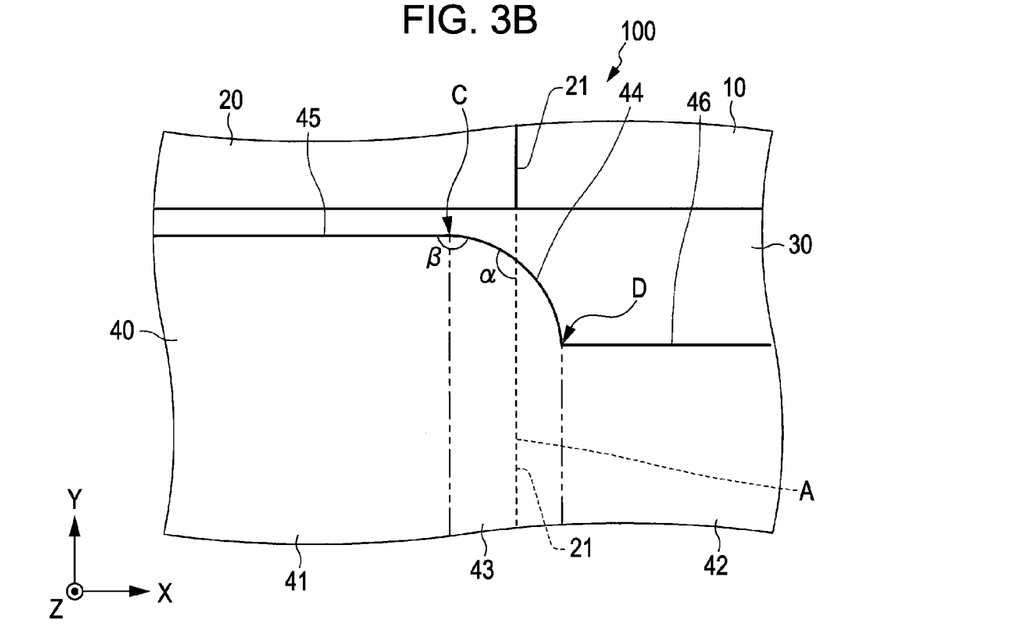

At first, a piezoelectric actuator according to the embodiment is described with reference to the drawings. FIGS. 1A and 1B are plan views schematically illustrating a piezoelectric actuator 100 according to the embodiment. FIG. 2A is a cross-sectional view schematically illustrating the piezoelectric actuator 100 according to the embodiment cut along a line IIA-IIA in FIG. 1A. FIG. 2B is a cross-sectional view schematically illustrating the piezoelectric actuator 100 according to the embodiment cut along a line IIB-IIB in FIG. 1A. FIG. 3A is an enlarged plan view schematically illustrating the main part of the piezoelectric actuator 100 according to the embodiment in FIG. 1A. FIG. 3B is an enlarged plan view schematically illustrating the main part of the piezoelectric actuator 100 according to the embodiment in FIG. 1B.

It is to be noted that in the description according to the invention, an expression "plan view" indicates a plan view when a target is seen from a normal line direction of a base surface (surface on which the piezoelectric actuator 100 is formed) of a substrate 1, which will be described later, for example.

As illustrated in FIG. 1A to FIG. 2B, the piezoelectric actuator 100 includes a vibration plate 10, a first electrode 20, a piezoelectric layer 30, and a second electrode 40. The piezoelectric actuator 100 is formed on the substrate 1, for example.

The substrate 1 is a flat plate formed by a conductive body, a semiconductor, or an insulating body, for example. The substrate 1 may have a single layer structure or a structure in which a plurality of layers are laminated. An inner configuration of the substrate 1 is not limited as long as an upper surface thereof has a planar shape. For example, a space and the like may be formed in the inside of the substrate 1. As a material of the substrate 1, silicon can be used, for example.

The vibration plate 10 is formed on the substrate 1. The vibration plate 10 is a plate-like member. As a material of the vibration plate, oxide such as silicon oxide or zirconium oxide, a metal such as SUS or nickel, or a laminate thereof can be used, for example. The vibration plate 10 has flexibility and can be deformed (bent) with an operation of the piezoelectric layer 30.

The first electrode 20 is formed on the vibration plate 10. The first electrode 20 is shaped into a layer form or a thin film form, for example. A thickness of the first electrode 20 is equal to or larger than 20 nm and equal to or smaller than 300 nm, for example.

The first electrode 20 has end surfaces 21 in a first direction (X-axis direction in an example as illustrated in the drawings and hereinafter, the first direction is also referred to as "X-axis direction") when seen from the above as illustrated in FIGS. 1A and 1B. The end surfaces 21 form an outer circumference of the first electrode 20 on the plan view. Further, the end surfaces 21 form first sides 21 extending in a second direction (hereinafter, the second direction is also referred to as "Y-axis direction") perpendicular to the X-axis direction.

As a material of the first electrode 20, various metals such as nickel, iridium, and platinum, conductive oxides thereof (for example, iridium oxide), composite oxide of strontium and ruthenium (SrRuOx: SRO), or composite oxide of lanthanum and nickel (LaNiOx: LNO) can be used, for example. The first electrode 20 may have a single layer structure of the material as described above or a structure in which the plurality of materials are laminated. The first electrode 20 forms a pair with the second electrode 40 and serves as one electrode (for example, lower electrode formed at a lower side of the piezoelectric layer 30) for applying a voltage to the piezoelectric layer 30.

It is to be noted that heat treatment at a high temperature (equal to or higher than 600° C.) is required to be performed for forming the piezoelectric layer 30, which will be described later. Therefore, each of the substrate 1, the vibration plate 10, and the first electrode 20 is desirably made of a material resistant to a high temperature.

It is to be noted that although not illustrated in the drawings, a layer which gives adhesiveness between the first electrode 20 and the vibration plate 10 may be formed therebetween, for example. A layer made of various metals such as zirconium and titanium or oxides thereof can be used as such layer, for example.

In addition, although not illustrated in the drawings, for example, a layer for supporting film formation of the piezoelectric layer 30 or improving characteristics thereof, may be formed between the first electrode 20 and the piezoelectric layer 30. For example, a film of titanium may be formed for controlling crystal orientation of the piezoelectric layer 30, for example.

As illustrated in FIG. 1A to FIG. 2B, the piezoelectric layer 30 may be formed on the vibration plate 10 and the first electrode 20. The piezoelectric layer 30 is shaped into a layer form or a thin film form, for example. A thickness of the piezoelectric layer 30 is equal to or larger than 300 nm and equal to or smaller than 3000 nm, for example.

The piezoelectric layer 30 is formed so as to intersect with the first sides 21 along the Y-axis direction and extend in the X-axis direction, as illustrated in FIGS. 1A and 1B. In an example as illustrated in FIGS. 1A and 1B, the piezoelectric layer 30 extends in the X-axis direction while a width thereof in the Y-axis direction is constant. A planar shape of the piezoelectric layer 30 is rectangular, for example.

As illustrated in FIG. 2A and FIG. 2B, the piezoelectric layer 30 has a driving region 32 and non-driving regions 34 while upper sides of the first sides 21 are set as boundaries. The driving region 32 is sandwiched between the first electrode 20 and the second electrode 40. The driving region 32 can be actively driven by being applied a voltage between the electrodes 20, 40. The non-driving regions 34 are not sandwiched between the first electrode 20 and the second electrode 40 and cannot be actively driven.

As illustrated in FIG. 2A, the piezoelectric layer 30 has an upper surface 36 and side surfaces 38. The upper surface 36 and the side surfaces 38 may be connected to each other at obtuse angles, for example. That is to say, the piezoelectric layer 30 has such shape that a width in the Y-axis direction becomes smaller upward (toward the +Z direction) and the side surfaces 38 may be tapered side surfaces. Although not illustrated in the drawings, the upper surface 36 and the side surfaces 38 may be connected to each other at right angles.

A piezoelectric material made of perovskite-type oxide can be used as the piezoelectric layer 30. To be more specific, as the material of the piezoelectric layer 30, lead zirconate titanate ($Pb(Zr,Ti)O_3$), lead zirconate titanate niobate ($Pb(Zr,Ti,Nb)O_3$), barium titanate ($BaTiO_3$), or potassium sodium niobate (($K,Na)NbO_3$) can be used. The piezoelectric layer 30 can have piezoelectricity.

The second electrode 40 is formed on the piezoelectric layer 30. The second electrode 40 is shaped into a layer form or a thin film form, for example. A thickness of the second electrode 40 is equal to or larger than 5 nm and equal to or smaller than 300 nm, for example.

The second electrode 40 is formed so as to intersect with the first sides 21 along the Y-axis direction and extend in the X-axis direction (first direction), as illustrated in FIG. 1A to FIG. 2B. In an example as illustrated in FIGS. 1A and 1B, the second electrode 40 is formed across the two first sides 21. However, the second electrode 40 may be formed across only one first side 21, for example.

The materials listed above as the material of the first electrode 20 can be used as that of the second electrode 40. The second electrode 40 forms a pair with the first electrode 20 and serves as the other electrode (for example, upper electrode formed at the upper side of the piezoelectric layer 30) for applying a voltage to the piezoelectric layer 30.

As illustrated in FIG. 1A, FIG. 1B and FIG. 2B, the second electrode 40 has a first portion 41 having a first width W1, second portions 42 each having a second width W2 which is smaller than the first width W1, and third portions 43 which connect the first portion 41 and the second portions 42. Although not illustrated in the drawings, the second portions 42 may not be arranged on both ends of the second electrode 40 in the X-axis direction and the second portion 42 may be arranged on only one end. That is to say, the third portion 43 may be one end of the second electrode 40 in the X-axis direction.

As illustrated in FIG. 1A, FIG. 1B, FIG. 2B, FIG. 3A, and FIG. 3B, the third portions 43 are arranged at the upper side of the first sides 21 of the first electrode 20. That is to say, the third portions 43 are overlapped with a part of the first sides 21 when seen from the above. With this, end surfaces of the driving region 32 of the piezoelectric layer 30 in the X-axis direction, which are along the Y-axis direction, are arranged at the lower side of the third portions 43. Details thereof are described later.

A third width W3 (not illustrated in FIG. 1A and FIG. 1B) of each third portion 43 is narrower from the first portion 41 to each second portion 42. Accordingly, the third width W3 satisfies a relationship of W1>W3>W2.

As illustrated in FIG. 3A and FIG. 3B, each third portion 43 has second sides 44 which form the outer circumference of the second electrode. Further, the first portion 41 has third sides 45 which form the outer circumference of the second electrode on the plan view. In addition, each second portion 42 has fourth sides 46 which form the outer circumference of the second electrode on the plan view. Each second side 44 connects each third side 45 and each fourth side 46. As illustrated in FIG. 3A, a connecting portion of each second side 44 and each third side 45 is assumed to be a connecting portion C. An internal angle of the connecting portion C (internal angle of a corner portion formed by each second side 44 and each third side 45) is assumed to be β. Note that the angle β is an obtuse angle. Further, a connecting portion of each second side 44 and each fourth side 46 is assumed to be a connecting portion D. As illustrated in FIG. 1B and FIG. 3B, the same holds true in a case where each second side 44 is a curved line.

As illustrated in FIG. 1A and FIG. 3A, the second sides 44 of each third portion 43 may be formed with straight lines. Alternatively, as illustrated in FIG. 1B and FIG. 3B, the second sides 44 of each third portion 43 may be formed in arc-like curved lines. Note that the arc-like curved line is an arc-like curved line protruded to the outer side of the second electrode 40 when seen from the above.

As described above, the third portions 43 are arranged at the upper side of the first sides 21 of the first electrode 20. In other words, if virtual lines at the upper side of the first sides 21 are assumed to be virtual lines A, the virtual lines A extending in the Y-axis direction intersect with the second sides 44. An angle of a corner portion formed by each virtual line A and each second side 44 is assumed to be α. As illustrated in FIG. 3A and FIG. 3B, the angle α is an angle facing to the side of a center (first portion 41) of the second electrode 40 and is an obtuse angle.

However, each second side 44 and each virtual line A intersect with each other on a portion excluding the connecting portion C. That is to say, although each virtual line A may intersect with each second side 44 on the connecting portion D as one end of the second side 44, each virtual line A does not intersect with each second side 44 on the connecting portion C as the other end of the second side 44. Each virtual line A does not intersect with each second side 44 on the connecting portion C such that a corner portion having a right angle or an acute angle is not formed on the driving region 32 when seen from the above.

A virtual line B as illustrated in FIG. 3A indicates a position of a side forming an outer circumference of a second electrode of a piezoelectric actuator according to a conventional technique. In the conventional technique, an angle γ at an intersection between the virtual line A and the virtual line B forms a corner portion on a driving region when seen from the above and an internal angle of the corner portion is a right angle. In this case, a difference in stress to be generated between a right side and a left side with respect to each first side 21 is generated over corner portions at upper and lower sides. Accordingly, the stress is easy to concentrate on such corner portions and there arises a possibility that cracking is generated around the corner portions. However, in the piezoelectric actuator 100 according to the embodiment, all the corner portions on the driving region 32 when seen from the above are formed at obtuse angles and a corner portion having a right angle or an acute angle is not formed. Therefore, a length on which the above difference in stress is generated is shortened so as to reduce the stress to be generated in comparison with the corner portions in the conventional technique.

Further, to be more preferable, each virtual line A may be arranged on the connecting portions D in a form where the second sides 44 are formed with arc-like curved lines, corner portions are not formed on the connecting portions C, and the second sides 44 and the third sides 45 are continuous to each other as illustrated in FIG. 3B. In this case, an outer shape of the driving region 32 when seen from the above does not have a corner portion. In other words, boundary surfaces as side surfaces of the driving region 32 along the Z-axis direction do not have a corner portion and are formed with flat surfaces which are smoothly continuous. With this, a stress to be generated on the boundary surface regions can be effectively suppressed, thereby improving reliability of the piezoelectric actuator 100.

Although not illustrated in the drawings, the third portions 43 may be formed in a mode obtained by combining the modes as illustrated in FIG. 3A and FIG. 3B. In other words, each second side 44 is formed in the following manner. That is, each second side 44 is partially formed with a straight line and the second side 44 around the connecting portion C is formed with an arc-like curved line. Further, each second side 44 and each third side 45 are continuous to each other such that a corner portion is not formed therebetween.

The second electrode 40 may further include fourth portions 47 which are electrically connected to the second portions 42 and each of which has a width of equal to or larger than the second width W2. Each fourth portion 47 may be a portion which is electrically connected to a driving circuit (not illustrated) and may be a lead wiring. Each fourth portion 47 may have a portion of which width is gradually larger from each second portion 42 and a portion having a constant width. A maximum wiring width of each fourth portion 47 may be the same as the first width W1. Alternatively, the maximum wiring width of each fourth portion 47 may be made larger than the first width W1. With this, an electrical resistance value of the second electrode 40 can be made smaller so that voltage drop due to electric resistance of the wiring itself can be reduced. Therefore, displacement of a piezoelectric element can be made constant and reliability of the piezoelectric actuator 100 can be improved. Although not illustrated in the drawings, the fourth portions 47 may be formed with a conductive material having relatively small electric resistance value and a preferable conductivity, such as gold, for example.

Although not illustrated in the drawings, a protection film may be formed from the first electrode 20 to an upper surface of the second electrode 40 through the side surfaces 38 of the piezoelectric layer 30.

Figure 4:
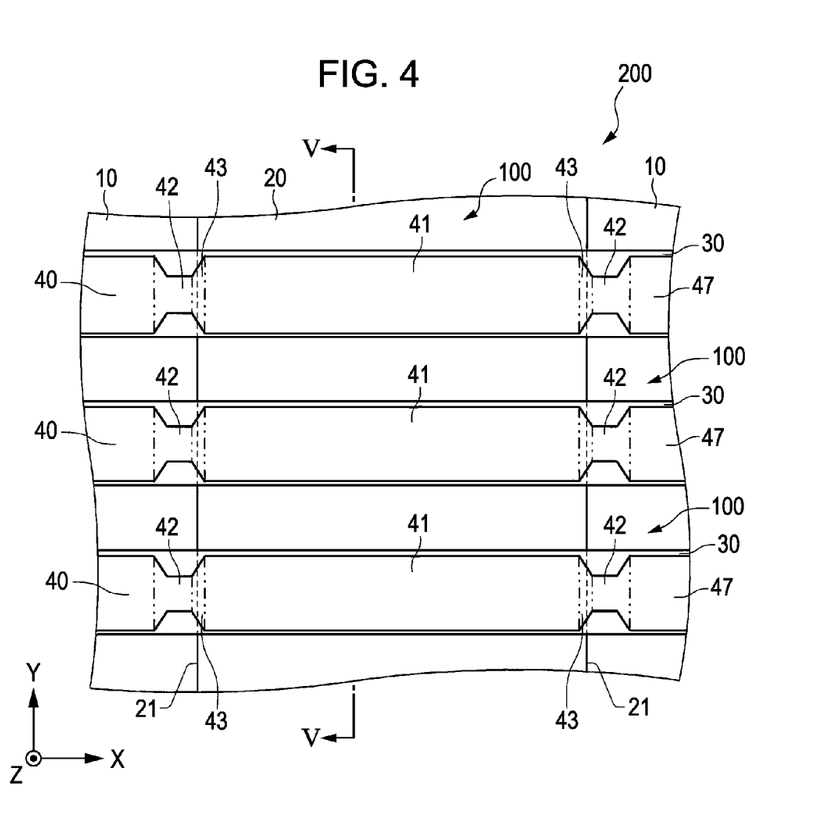
FIG. 4 is a plan view schematically illustrating a piezoelectric actuator according to a variation of the embodiment.
Figure 5:
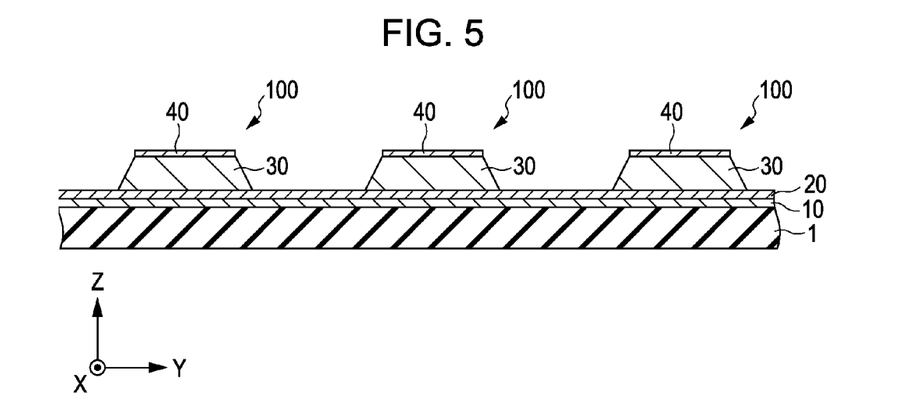
FIG. 5 is a cross-sectional view schematically illustrating the piezoelectric actuator according to the variation of the embodiment.

FIG. 4 is a plan view schematically illustrating a piezoelectric actuator 200 as a variation of the piezoelectric actuator 100 according to the embodiment. FIG. 5 is a cross-sectional view schematically illustrating the piezoelectric actuator 200 according to the embodiment cut along a line V-V in FIG. 4.

As illustrated in FIG. 4 and FIG. 5, a plurality of second electrodes 40 are arranged along the Y-axis direction. In the same manner, a plurality of piezoelectric layers 30 are also arranged along the Y-axis direction. In an example as illustrated in the drawings, three second electrodes 40 are provided. However, the number of the second electrodes 40 is not limited. The plurality of second electrodes 40 are electrically separated from each other and function as individual electrodes. That is to say, a voltage can be individually applied to the plurality of piezoelectric layers 30. On the other hand, one first electrode 20 is provided for the plurality of second electrodes 40 and functions as a common electrode.

The piezoelectric actuator 100 (200) according to the embodiment has the following characteristics, for example.

According to the piezoelectric actuator 100 (200), the third portions 43 of the second electrode 40 are arranged at the upper side of the first sides 21 of the first electrode 20. If virtual lines at the upper side of the first sides 21 are assumed to be virtual lines A, the virtual lines A extending in the Y-axis direction intersect with the second sides 44. With this, the first sides 21 of the first electrode 20 can be formed such that an outer circumference of the driving region 32 when seen from the above does not include a corner portion having a right angle or an acute angle while keeping shapes of the first sides 21 of the first electrode 20 so as to extend in the Y-axis direction. With this, stresses around boundary surfaces between the driving region 32 and the non-driving regions 34 of the piezoelectric layer 30 can be made moderate, thereby suppressing cracking from being generated. As a result, the piezoelectric actuator 100 (200) can have high reliability.

Further, as described above, according to the piezoelectric actuator 100 (200), a shape of the first electrode 20 can be kept such that the first sides 21 extend in the Y-axis direction. Accordingly, the piezoelectric layer 30 which grows on an end surface of the first electrode 20 on a crystallized interface of the piezoelectric layer 30 formed on the first electrode 20 can be made minimum. With this, cracking can be suppressed from being generated without deteriorating reliability of the piezoelectric layer 30. Details thereof are descried later.

2. Piezoelectric Actuator Manufacturing Method

Next, a method of manufacturing the piezoelectric actuator according to the embodiment is described with reference to the drawings. FIG. 6 to FIG. 10 are cross-sectional views schematically illustrating a manufacturing process of the piezoelectric actuator 100 corresponding to FIG. 2A according to the embodiment.

Figure 6:
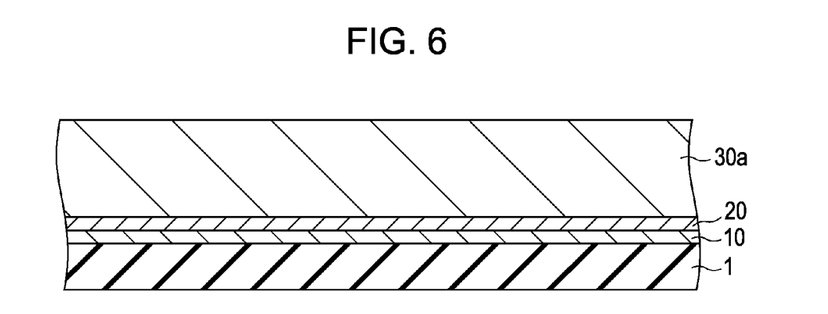
FIG. 6 is a cross-sectional view schematically illustrating a manufacturing process of the piezoelectric actuator according to the embodiment.

As illustrated in FIG. 6, the vibration plate 10 is formed on the substrate 1. The vibration plate 10 is formed by laminating a silicon oxide layer and a zirconium oxide layer in this order, for example. The silicon oxide layer is formed by a thermal oxidation method, for example. The zirconium oxide layer is formed by a sputtering method, for example.

Next, the first electrode 20 is formed on the vibration plate 10. For example, the first electrode 20 is formed by film-forming a conductive layer (not illustrated), and then, patterning the conductive layer. The conductive layer is film-formed by the sputtering method, a vacuum deposition method, a Metal Organic Chemical Vapor Deposition (MOCVD) method, or a plating method, for example.

Next, a piezoelectric film layer 30*a* is formed on the vibration plate 10 and the first electrode 20. The piezoelectric film layer 30*a* is film-formed by the sputtering method, a laser ablation method, the MOCVD method, a sol-gel method, or a Metal Organic Deposition (MOD) method, for example.

Figure 7:
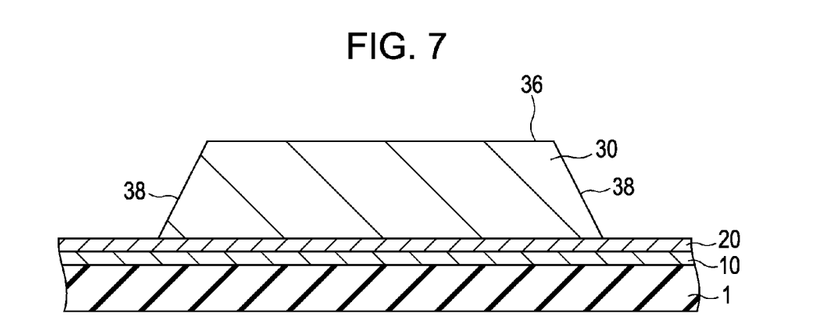
FIG. 7 is a cross-sectional view schematically illustrating the manufacturing process of the piezoelectric actuator according to the embodiment.

As illustrated in FIG. 7, the piezoelectric film layer 30*a* is patterned so as to form the piezoelectric layer 30. The patterning can be performed such that the side surfaces 38 of the piezoelectric layer 30 are connected to the upper surface 36 at obtuse angles. If such mode of the piezoelectric actuator 100 is employed in this manner, larger portions of the piezoelectric layer 30 can be formed on the upper surface of the first electrode 10.

Figure 8:
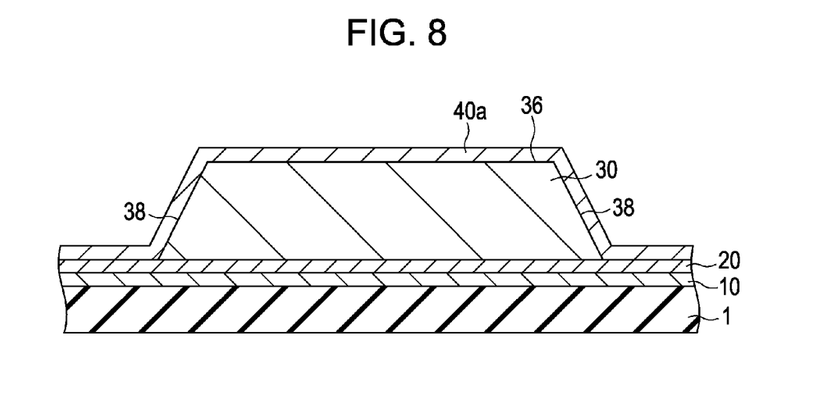
FIG. 8 is a cross-sectional view schematically illustrating the manufacturing process of the piezoelectric actuator according to the embodiment.

As illustrated in FIG. 8, a conductive layer 40a is film-formed on the entire surface. The conductive layer 40a is film-formed by the sputtering method, the vacuum evaporation method, or the MOCVD method, for example.

As illustrated in FIG. 2A, the conductive layer 40a is patterned by a photolithography technique and an etching technique, for example, so as to form the second electrode 40.

It is to be noted that the upper surface 36 and the side surfaces 38 of the piezoelectric layer 30 are connected to each other at obtuse angles as described above. Therefore, when the conductive layer 40a is patterned, even if a mask positioning is deviated, the first electrode 20 can be prevented from being etched with the side surfaces 38.

The piezoelectric actuator 100 according to the embodiment can be manufactured with the above processes.

In the above description, the patterning of the piezoelectric film layer 30a and the patterning of the conductive layer 40a are performed in different processes. However, they can be also performed in the same process.

Figure 9:
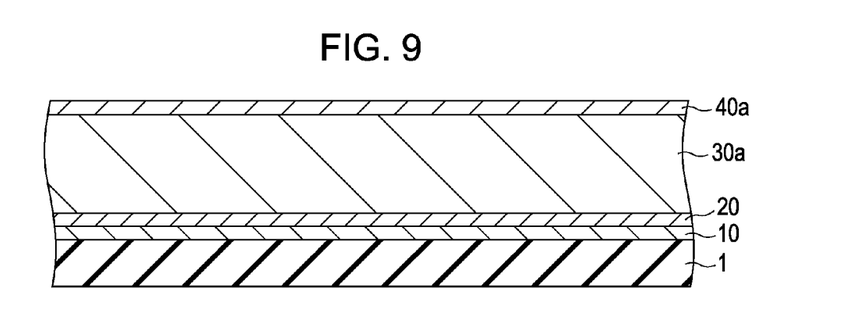
FIG. 9 is a cross-sectional view schematically illustrating the manufacturing process of the piezoelectric actuator according to the embodiment.

That is to say, after the piezoelectric film layer 30a has been film-formed, the conductive layer 40a is film-formed on the piezoelectric film layer 30a as illustrated in FIG. 9.

Figure 10:
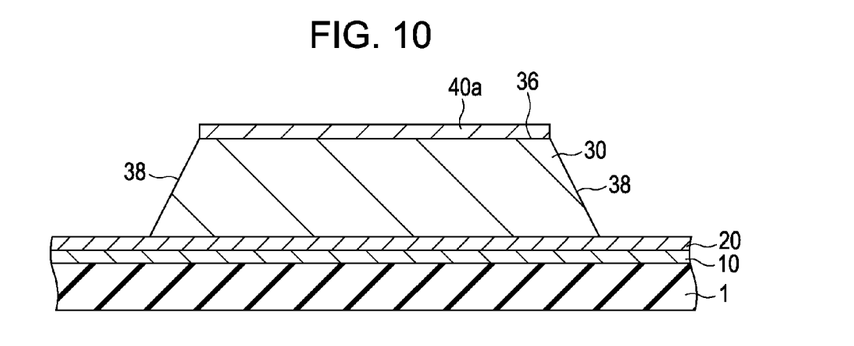
FIG. 10 is a cross-sectional view schematically illustrating the manufacturing process of the piezoelectric actuator according to the embodiment.

Next, as illustrated in FIG. 10, the piezoelectric film layer 30a and the conductive layer 40a are patterned at the same time with the well-known photolithography technique and etching technique, for example, so as to form the piezoelectric layer 30 and the second electrode 40. At this time, the side surfaces 38 of the piezoelectric layer 30 are desirably connected to the upper surface 36 at obtuse angles.

If patterning is performed after the conductive layer 40a has been film-formed in this manner, an interface between the piezoelectric film layer 30a and the conductive layer 40a can be preferably kept. That is to say, process damage due to the patterning can be avoided, thereby improving reliability of the piezoelectric layer 30.

It is desirable that the upper surface 36 and the side surfaces 38 of the piezoelectric layer 30 are connected to each other at obtuse angles as described above. In this case, even if a mask positioning is deviated in the patterning for forming the first portion 41, the first electrode 20 can be prevented from being etched with the side surfaces 38.

With the method of manufacturing the piezoelectric actuator 100, the piezoelectric actuator 100 which can suppress cracking from being generated and has high reliability can be manufactured.

3. Liquid Ejection Head

Figure 11:
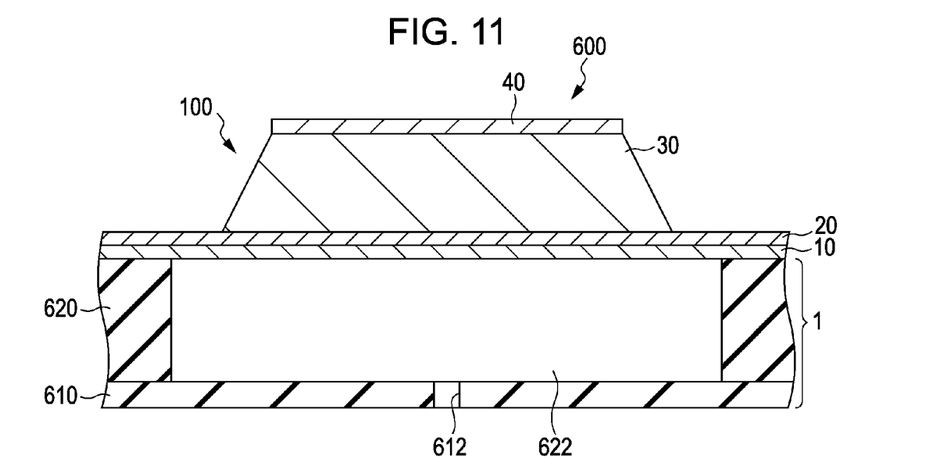
FIG. 11 is a cross-sectional view schematically illustrating a liquid ejection head according to an embodiment.
Figure 12:
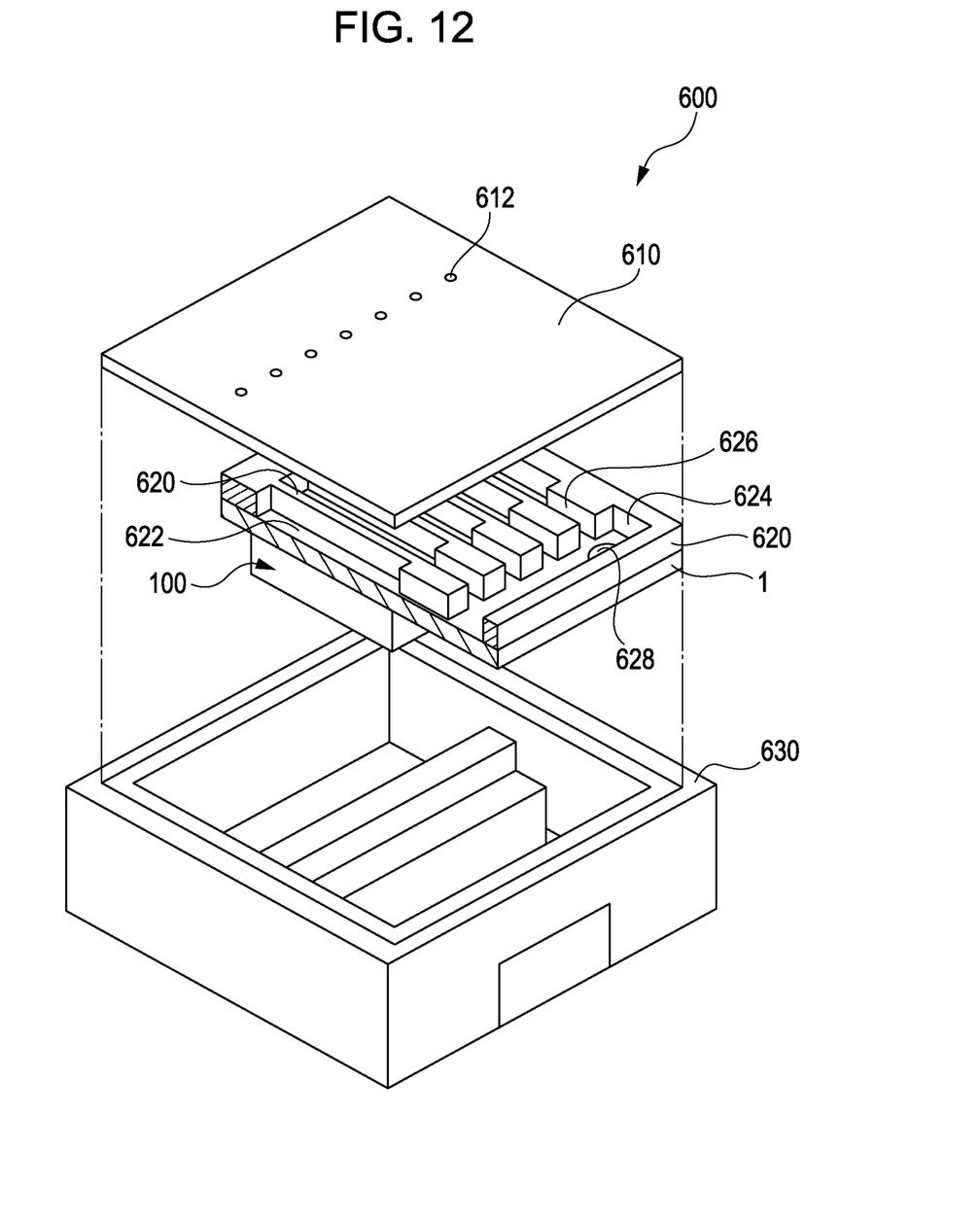
FIG. 12 is an exploded perspective view schematically illustrating the liquid ejection head according to the embodiment.

Next, a liquid ejection head according to the embodiment is described with reference to the drawings. FIG. 11 is a cross-sectional view schematically illustrating the main part of a liquid ejection head 600. FIG. 12 is an exploded perspective view of the liquid ejection head 600 and illustrates a state where a normally used state is upside down.

The liquid ejection head 600 has a piezoelectric actuator according to the invention. Hereinafter, an example in which the piezoelectric actuator 100 is used as the piezoelectric actuator according to the invention is described.

As illustrated in FIG. 11 and FIG. 12, the liquid ejection head 600 includes a nozzle plate 610, a flow path formation substrate 620, the piezoelectric actuator 100, and a housing 630, for example. It is to be noted that in FIG. 12, the piezoelectric actuator 100 is simplified.

As illustrated in FIG. 11 and FIG. 12, the nozzle plate 610 has nozzle holes 612. Ink is discharged through the nozzle holes 612. For example, a plurality of nozzle holes 612 are provided on the nozzle plate 610. In an example as illustrated in FIG. 12, the plurality of nozzle holes 612 are formed in a row. As a material of the nozzle plate 610, silicon or stainless steel (SUS) can be used, for example.

The flow path formation substrate 620 is provided at the upper side of the nozzle plate 610 (lower side of the nozzle plate 610 in the example as illustrated in FIG. 12). As the material of the flow path formation substrate 620, silicon can be used, for example. The flow path formation substrate 620 divides a space between the nozzle plate 610 and the vibration plate 10. With this, as illustrated in FIG. 12, a reservoir (liquid storing portion) 624, supply ports 626 communicating with the reservoir 624, and pressure generation chambers 622 communicating with the supply ports 626 are provided. In the example as illustrated in FIG. 12, the reservoir 624, the supply ports 626, and the pressure generation chambers 622 are separated from each other. However, any of them are flow paths (for example, which can be also referred to as manifolds) of liquid and these flow paths may be arbitrary designed. For example, the supply ports 626 have such shapes that portions of flow paths are made narrower in the example as illustrated in the drawing. However, the supply ports 626 can be arbitrary formed based on design and this configuration is not essential.

The reservoir 624 can temporarily store ink supplied from the outside (for example, ink cartridge) through a through-hole 628 provided on the vibration plate 10. Ink in the reservoir 624 can be supplied to the pressure generation chambers 622 through the supply ports 626. Volumes of the pressure generation chambers 622 change due to deformation of the vibration plate 10. The pressure generation chambers 622 communicate with the nozzle holes 612. If volumes of the pressure generation chambers 622 are changed, ink or the like is discharged through the nozzle holes 612.

It is to be noted that the reservoir 624 and the supply ports 626 may be provided on a different member (not illustrated) from the flow path formation substrate 620 as long as they communicate with the pressure generation chambers 622.

The piezoelectric actuator 100 is provided at the upper side of the flow path formation substrate 620 (lower side thereof in the example as illustrated in FIG. 12). The piezoelectric actuator 100 is electrically connected to a driving circuit (not illustrated) and can operate (vibrate, deform) based on a signal of the driving circuit. The vibration plate 10 is deformed by operation of the piezoelectric layer 30 and can change inner pressure of the pressure generation chambers 622 appropriately.

As illustrated in FIG. 12, the housing 630 can accommodate the nozzle plate 610, the flow path formation substrate 620, and the piezoelectric actuator 100. As a material of the housing 630, a resin, a metal, or the like can be used, for example.

The liquid ejection head 600 has the piezoelectric actuator 100 (200) having high reliability. Accordingly, the liquid ejection head 600 can have high reliability.

In the above example, a case where the liquid ejection head 600 is an ink jet recording head has been described. However, the liquid ejection head according to the embodiment can be used as a color material ejection head used for manufacturing a color filter of a liquid crystal display, an electrode material ejection head used for forming an electrode of an organic El display or a field emission display (EFD), a bioorganic compound ejection head used for manufacturing a bio chip, and the like.

4. Liquid Ejection Apparatus

Figure 13:
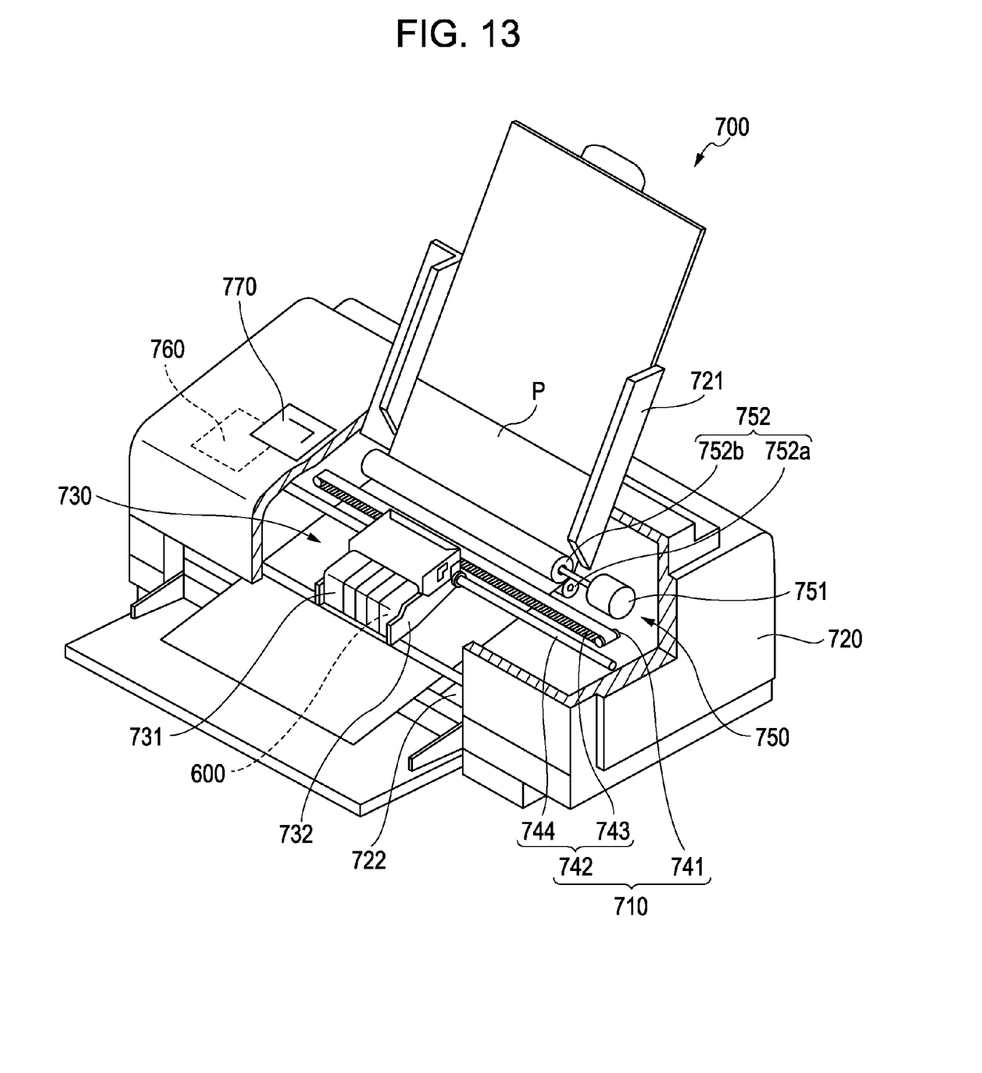
FIG. 13 is a perspective view schematically illustrating a liquid ejection apparatus according to an embodiment.

Next, a liquid ejection apparatus according to the embodiment is described with reference to the drawings. FIG. 13 is a perspective view schematically illustrating a liquid ejection apparatus 700 according to the embodiment.

The liquid ejection apparatus 700 has the liquid ejection head according to the invention. Hereinafter, an example in which the liquid ejection head 600 is used as the liquid ejection head according to the invention is described.

As illustrated in FIG. 13, the liquid ejection apparatus 700 includes a head unit 730, a driving portion 710, and a controller 760. The liquid ejection apparatus 700 can further include an apparatus main body 720, a sheet feeding portion 750, a tray 721 on which recording paper P is installed, a discharge port 722 which discharges the recording paper P, and an operation panel 770 which is arranged on an upper surface of the apparatus main body 720.

The head unit 730 has an ink jet recording head (hereinafter, simply referred to as "head") constituted by the above-described liquid ejection head 600. The head unit 730 further includes an ink cartridge 731 which supplies ink to the head and a transportation unit (carriage) 732 on which the head and the ink cartridge 731 are arranged.

The driving portion 710 can make the head unit 730 reciprocate. The driving portion 710 includes a carriage motor 741 as a driving source of the head unit 730, and a reciprocating mechanism 742 which makes the head unit 730 reciprocate with rotation of the carriage motor 741.

The reciprocating mechanism 742 includes a carriage guiding shaft 744 of which both ends are supported by a frame (not illustrated), and a timing belt 743 which extends in parallel with the carriage guiding shaft 744. The carriage guiding shaft 744 supports the carriage 732 such that the carriage 732 can freely reciprocate. Further, the carriage 732 is fixed to a part of the timing belt 743. If the timing belt 743 travels with the operation of the carriage motor 741, the head unit 730 reciprocates by being guided by the carriage guiding shaft 744. Ink is appropriately discharged at the time of the reciprocating operation so that printing is performed on the recording paper P.

It is to be noted that in the embodiment, an example in which the liquid ejection apparatus which performs printing while both of the liquid ejection head 600 and the recording paper P move. However, it is sufficient that the liquid ejection apparatus according to the invention has a mechanism in which printing is performed on the recording paper P while positions of the liquid ejection head 600 and the recording paper P are relatively changed to each other. In addition, in the embodiment, an example in which printing is performed on the recording paper P has been described. However, a recording medium on which printing can be performed by the liquid ejection apparatus according to the invention is not limited to paper and may be various media such as a fabric, a film, and a metal. Configurations thereof can be changed appropriately.

The controller 760 can control the head unit 730, the driving portion 710 and the sheet feeding portion 750.

The sheet feeding portion 750 can feed the recording paper P to the side of the head unit 730 from the tray 721. The sheet feeding portion 750 includes a sheet feeding motor 751 as a driving source thereof and a sheet feeding roller 752 which rotates by operating the sheet feeding motor 751. The sheet feeding roller 752 includes a driven roller 752a and a driving roller 752b which are opposed to each other at the upper and lower sides sandwiching a feeding path of the recording paper P. The driving roller 752b is coupled to the sheet feeding motor 751. If the sheet feeding portion 750 is driven by the controller 760, the recording paper P is fed so as to pass through the lower side of the head unit 730. The head unit 730, the driving portion 710, the controller 760 and the sheet feeding portion 750 are provided inside the apparatus main body 720.

The liquid ejection apparatus 700 includes the liquid ejection head 600 having high reliability. Accordingly, the liquid ejection apparatus 700 can have high reliability.

It is to be noted that the above embodiments and variations are merely examples and do not limit the invention. For example, each embodiment and each variation can be appropriately combined, for example.

The embodiments of the invention have been described in detail above. However, those skilled in the art would understand easily that many variations without substantially departing from novel matters and effects of the invention can be made. Accordingly, these variations are all encompassed within the range of the invention.

What is claimed is:

1. A piezoelectric actuator comprising:
   a first electrode which is formed on a base surface of a vibration plate;
   a piezoelectric layer which is formed on the base surface of the vibration plate and the first electrode; and
   a second electrode which is formed on the piezoelectric layer so as to extend in an X-axis direction,
   wherein the second electrode has a first portion having a first width, a second portion having a second width which is smaller than the first width, and a third portion which connects the first portion and the second portion, wherein a third width of the third portion narrows from the first portion toward the second portion, wherein the widths are measured in a Y-axis direction transverse to the X-axis direction,
   wherein the first electrode has a first side which forms an outer edge of the first electrode on a plan view when seen from a Z-axis direction of the base surface and which extends in the Y-axis direction, wherein the Z-axis direction is transverse to the X-axis direction and the Y-axis direction, and
   wherein the third portion of the second electrode is disposed immediately above the first side of the first electrode in the Z-axis direction, with no offset in the X-axis direction or the Y-axis direction.

2. The piezoelectric actuator according to claim 1,
   wherein the third portion has a second side which forms an outer edge of the second electrode on the plan view when seen from the Z-axis direction, and
   an angle formed between the first side of the first electrode and the second side is an obtuse angle.

3. The piezoelectric actuator according to claim 2, wherein the second side of the third portion includes a straight line.

4. The piezoelectric actuator according to claim 2, wherein the second side of the third portion includes an arc-like curved line.

5. The piezoelectric actuator according to claim 1,
   wherein a plurality of second electrodes are arranged in parallel along the second direction,
   the plurality of second electrodes are individual electrodes which are separated from each other, and
   the first electrode is a common electrode which is common to the plurality of second electrodes.

6. The piezoelectric actuator according to claim 1, wherein the second electrode further comprises a fourth portion which is electrically connected to the second portion and has a width in the Y-axis direction of equal to or larger than the second width.

7. A liquid ejection head comprising the piezoelectric actuator according to claim 1.

8. A liquid ejection apparatus comprising the liquid ejection head according to claim 7.

* * * * *